United States Patent [19]

Briska et al.

[11] 4,034,130
[45] July 5, 1977

[54] METHOD OF GROWING PYROLYTIC SILICON DIOXIDE LAYERS

[75] Inventors: Marian Briska; Ewald Eisenbraun, both of Boblingen, Germany

[73] Assignee: International Business Machines Corporation, Armonk, N.Y.

[22] Filed: Sept. 22, 1975

[21] Appl. No.: 615,258

[30] Foreign Application Priority Data

Oct. 3, 1974 Germany .................... 2447224

[52] U.S. Cl. .............................. 427/248 C; 427/95
[51] Int. Cl.² ........................................ C23C 11/00
[58] Field of Search ............. 427/248 C, 248 B, 95

[56] References Cited

UNITED STATES PATENTS

| 3,243,314 | 3/1966 | Lehamn et al. ................... 427/95 |
| 3,607,378 | 9/1971 | Ruggiero .......................... 427/95 |
| 3,681,13? | 8/1972 | Pammer et al. ............. 427/248 C |

FOREIGN PATENTS OR APPLICATIONS 885,118  12/1961  United Kingdom ................. 427/95

OTHER PUBLICATIONS

Aylett et al., *Chem. Abs.* vol. 79, No. 121416e (1973).
Beattie, *Chem. Abs.* vol. 51, No. 7213g (1957).

*Primary Examiner*—Harry J. Gwinnell
*Attorney, Agent, or Firm*—George O. Saile

[57] ABSTRACT

The method of producing pyrolytic $SiO_2$ on the surface of a substrate comprises mixing $SiH_4$ and $NOCl$ in an atmosphere of carrier gas, and passing the gas mixture over the heated substrate. With this process, precipitation of $SiO_2$ on the walls of the reaction chamber is avoided.

7 Claims, No Drawings

METHOD OF GROWING PYROLYTIC SILICON DIOXIDE LAYERS

BACKGROUND OF THE INVENTION

The invention relates to a method of growing pyrolytic silicon dioxide ($SiO_2$) layers on heated substrates, a reaction taking place between silane ($SiH_4$) and an oxidant in the presence of a carrier gas.

DESCRIPTION OF THE PRIOR ART

Together with the trend toward circuits of an increasingly large-scale integration, and having an increasing flatness of the diffusion layers, the interest in processes where chemical reactions are used for layer growing in the vapor phase has increased, too. The particular importance of these processes consists in that they permit the generation of layers of $SiO_2$, the most important insulation material for silicon semiconductors. The processes for the growing of pyrolytic $SiO_2$ layers differs advantageously from the processes for growing thermal silicon dioxide in that the former growing process can be performed with higher growing rates but generally at lower temperatures nevertheless. Lower temperatures are an essential advantage particularly in those cases where the growing process takes place after already diffused p/n junctions have been formed in the semiconductor material, because at high temperatures the diffusion fronts migrate further into the semiconductor material. When working under manufacturing conditions, however, it has become evident that compared with thermal $SiO_2$ layers the pyrolytic $SiO_2$ layers show a lower density which, however, can be compensated by means of an additional processing step where the oxide is densified. A far more decisive factor is that the number of charge carriers per $cm^2$ is higher in the pyrolytic $SiO_2$ layers than in the thermal layers.

In the processes for growing pyrolytic $SiO_2$ layers it is normally not the entire apparatus but merely the substrate holder with the substrates which is heated to the reaction temperature. Over these heated substrates the gas mixture is then passed which contains a silicon compound, in most cases $SiH_4$, and the oxidant. On the substrate surface, or in its immediate vicinity, the reaction then takes place which causes the growing of the layer. Known oxidants for making pyrolytic $SiO_2$ are oxygen ($O_2$), nitrous oxide ($N_2O$), nitrogen dioxide ($NO_2$), nitrogen monoxide (NO), and carbon dioxide ($CO_2$), $O_2$, $N_2O$, and $NO_2$ react with $SiH_4$ at low temperatures already. As consequently the generation of the $SiO_2$ takes place not only in the immediate proximity of the substrate surface and the surface of the substrate holder, but in the entire reaction chamber the $SiO_2$ formed precipitates in the entire inside of the apparatus.

As it is standard practice to control the processes for growing pyrolytic $SiO_2$ either visually or with optical means, for which reason the reaction vessel is normally made of transparent quartz glass, or has at least one quartz glass window within the substrate range, the quartz glass has to remain transparent for the entire duration of the growing process. This, however, is not possible when $SiO_2$ which has been formed is deposited on the inside of the quartz glass. Furthermore, part of the $SiO_2$ which has not been formed on the substrate surface falls onto the substrate surface in the form of flakes, so that elevations appear thereon which are not removable and which are damaging in the manufacturing process and for the product. Besides, the $SiO_2$ precipitation requires time-consuming cleaning of the reaction vessel, and as only a fraction of the $SiO_2$ formed precipitates on the substrates large quantities of $SiH_4$ are needed.

With NO and $CO_2$ as oxidants, there are no such complications. However, NO presents the following difficulty: NO is a gas with a low boiling point and has therefore to be stored under high pressure, so that valves and pressure reducers have to be made of metal. NO, however, is highly reactive with $O_2$ and $H_2O$, i.e. for instance with the oxygen and water vapor in the air, and it forms metal-corroding reaction products in that process. For that reason, a rapid corrosion of the valves and pressure reducers is practically inevitable. The result is an increased safety risk and the danger that highly undesirable metal impurities reach the reaction tube. This difficulty does not exist in connection with $CO_2$. It should, therefore, be preferred among all known oxidants for the growing of pyrolytic $SiO_2$; the more so as the best results obtained with NO resemble those reach with $CO_2$.

SUMMARY OF THE PRESENT INVENTION

It is the object of the invention to provide a method of growing pyrolytic $SiO_2$ layers, where the growing, for its entire duration, can be observed without any complications and where it takes place with a speed required for manufacturing, at minimum temperatures and under safety regulations not exceeding standard directives, and where said growing permits the generation of $SiO_2$ layers remarkable for their minimum number of charge carriers.

This problem is solved by means of a method of the above specified type in that $SiH_4$ is made to react in the carrier gas atmosphere at a predetermined substrate temperature with nitrosyl chloride (NOCl) as oxidant.

DESCRIPTION OF THE PREFERRED EMBODIMENTS

NOCl decomposes only at more than 700° C in remarkable quantities into active NO and active chlorine. At about the same temperatures the active NO reacts with the $SiH_4$. As these reactions take place at the above temperatures only it is no problem to restrict them to the immediate vicinity of the substrate surface or of the surface of the substrate holder, respectively. No $SiO_2$ will therefore precipitate on the inner walls of the reaction vessel. NOCl is a gas with a high boiling point. It can therefore be stored at a pressure of less than 2 kp $cm^{-2}$. This has the advantage that the danger of an uncontrolled exit of NOCl is low, and that valves can be used which are made of plastic material and therefore cannot corrode. Contrary to NO, the handling of NOCl therefore does not require any severe safety regulations, for the above given reasons, and the danger of metallic impurities being carried into the reaction tube does not exist, either. The active chlorine contributes to the reduction of the number of charge carriers per $cm_2$ in that, first, it forms volatile chlorides with part of the disturbing cations and, second, it is included into the $SiO_2$ layer and fixes disturbing charges there. $SiO_2$ layers which have been formed using NOCl as oxidant therefore have charge carrier numbers per $cm^2$ which are about one order of magnitude below those reached when $CO_2$ is used as oxidant or below $10^{12}$ charges per $cm^2$. In order to obtain the same growing rates as with $CO_2$ as an oxidant temperatures will suffice, when the remaining conditions are unchanged, which are more than 100° C lower than when $CO_2$ as oxidant is employed.

It is advantageous when NOCl and $SiH_4$ are mixed in a volume ratio between approximately 4:1 and approximately 50:1. At a volume ratio of less than 4:1 there is the risk of the $SiH_4$ partly reacting with the nitrogen of the NOCl, forming more or less nitrogen-enriched silicon oxinitride; at higher temperatures, if there is only a slight surplus of NOCl, a decomposition of the $SiH_4$ in silicon and hydrogen furthermore superposes the oxidation reaction. With volume ratios of more than 50:1 the grown-on $SiO_2$ layers do no longer alter their characteristics, and the growth rate can no longer be increased there, either. It would therefore be uneconomical to go beyond this volume ratio.

Particularly favorable properties with respect to the growth rate and number of charge carriers per cm² of the growing layers are reached when NOCl and $SiH_4$ are mixed in a volume ratio of approximately 13:1.

It is of advantage to perform the growing process at predetermined substrate temperatures between approximately 780° and approximately 1000° C. At temperatures of less than 780° C the decomposition rate of the NOCl and the speed of the oxidation reaction is too low for reaching growth rates of the necessary order. At temperatures of more than 1000° C the decomposition speed of the $SiH_4$ is already so high that the decomposition reaction can no longer be suppressed, not even by a high surplus of NOCl. As the growing rates required for an industrial process can be reached at temperatures of less than 900° C it is advantageous to perform the growing process at temperatures below 900° C. At temperatures below 900° C the doping elements usual in semiconductor technology diffuse so slowly in silicon that there is no significant shifting of p/n junctions diffused previously, during the growing of the $SiO_2$ layer.

It is advantageous when the pyrolyzing process takes place at a substrate temperature of 880° C in a gas flow composed of 30 liters nitrogen per minute, 0.5 liters argon containing 5 volume percent $SiH_4$, and 0.15 liters NOCl per minute, and flowing through a reaction tube with a flow cross-section of approximately 40 cm².

The invention will be described by means of embodiments.

The chemical reactions taking place in the carrying out of the process described here are not precisely known. It is known that at more than 700° C with rising temperature, nitrosyl chloride decomposes into active NO and active chlorine. Only if there is an insufficient amount of oxygen atoms for the reaction with the silicon atoms, i.e. when there are not more oxygen atoms per silicon atom than required for the stoichiometric reaction into $SiO_2$, the nitrogen atoms will react with the silicon atoms in significant quantities to form a silicon oxinitride more or less rich in nitrogen. The active chlorine advantageously reduces the number of disturbing charges in the growing oxide layer in that it is partly incorporated in the layer and partly forms volatile chlorides with existing metal ions. At temperatures of more than 950° C silane decomposes in accordance with the following reaction equation:

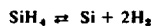

The balance increasingly shifts toward the right with rising temperatures. This reaction is undesirable as the silicon generated thereby reacts with the oxygen either not at all, or uncontrollably, and is partly incorporated in elementary form in the growing layer.

For carrying out the method described here devices can be suitably used where the substrates placed on an inductively heatable substrate holder of graphite or silicon are in a reaction chamber made of quartz glass or at least having windows made of quartz glass for the observation of the reaction, and where a gas mixture consisting of silane, NOCl, and the carrier gas or gases flows through the reaction chamber and over the substrates. The substrate holder can be inductively heated by a coil surrounding the reaction chamber. For measuring the temperature of the substrates an optical pyrometer can be used.

In order to ensure a homogeneous thickness of the growing layers on all substrates processed at one and the same time the gas mixture has to flow turbulently through the reaction chamber. For that purpose, a minimum gas quantity is required which depends on the flow cross-section. The required gas quantity is obtained in that the reaction gases are diluted with a carrier gas not participating in the reaction. However, an excessive flow speed should be avoided because otherwise the reaction gases passing over the heated substrates will have no time for being heated to their reaction temperature.

In order to avoid, as pointed out above, a reaction between the $SiH_4$ and the nitrogen of the NOCl, and/or that elementary silicon is formed at higher temperatures, the NOCl is always used in excess. Favorable results have been obtained when the volume ratio of NOCl to $SiH_4$ lies between approximately 4:1 and approximately 50:1. With a volume ratio higher than 4 the above mentioned undesired reaction are sure not to take place; and NOCl surplus which would increase the volume ratio over 50:1 does no longer influence the reaction. Particularly advantageous results were obtained with an NOCl: $SiH_4$ volume ratio of approximately 13:1. The growth rate is substantially determined by the $SiH_4$ concentration in the gas mixture, by the substrate temperature, and to a lesser degree by the $SiH_4$:NOCl ratio. Growth rates as they are required for a manufacture process were obtained with a volume ratio of $SiH_4$ to total gas volume between approximately 1:600 and approximately 1:1200, the total gas quantity being approximately 30:1 per minute, and the reaction tube having a flow cross-section of approximately 40 cm², and a substrate temperatures between 780° and 1000° C. At temperatures of less than 780° the decomposition of NOCl into active NO and active chlorine is too slow. At temperatures of more than 1000° C the decomposition reaction of the $SiH_4$ has already reached such a speed that even with a large NOCl surplus it represents a considerable competitor for the $SiO_2$ generation.

Below, the invention will be described with more detail by means of three examples. It should be pointed out here that the described process can also take place under conditions other than those given in the first two examples.

EXAMPLES 1, 2 and 3

In Examples 1 and 2, NOCl, and in Example 3, $CO_2$ is used as oxidant. Example 3 is to demonstrate the advantages of the process described here as compared to the most favorable of the known methods. The essential conditions of the given examples, the growth rates and, for two examples, also the number of the charge carriers per $cm^2$ of the grown layers are listed in the following table:

Table

| Ex. No. | Oxidant | Volume ratio $SiH_4$ oxidant | Volume ratio $SiH_4$ : carrier gas | Carrier gas l/min | Substr. Temp. (°C) | Growth rate (A/min) | Charges per $cm^2$ |
|---|---|---|---|---|---|---|---|
| 1 | NOCl | 1:6 | 1:1200 | $N_2$ 30 | 880 | 90 ± 10 | 1 to 11 |
| 2 | NOCl | 1:12.6 | 1: 600 | $N_2$ 30 | 880 | 220 ± 20 | 3 × 10 |
| 3 | $CO_2$ | 1:4 | 1: 900 | $H_2$ 27 | 980 | 70 ± 8 | > $10^{12}$ |

In the realization of the three examples, a device has been used where the reaction chamber was in an approximately horizontal tube of quartz glass which was 860 mm long and had a rectangular cross-section with an internal height of 50 mm and an internal width of 100 mm. The one open end of the reaction tube could be closed with a ground glass stopper to which a gas outlet tube had been joined by fusion. The gas inlet tube opened into the other closed end of the reaction tube. The substrate holder being approximately 10 mm high and approximately 90 mm wide and holding the substrates was pushed into the reaction tube from the open end until the substrate first rinsed by the gas mixture was at a distance of approximately 35 cm from the gas inlet opening. Shortly before the mouth of the gas inlet tube into the reaction tube the components of the gas mixture were joined. Pushed over the reaction tube there was a coil for the inductive heating. The coil was longer than the substrate holder and arranged thereto in such a manner that it protruded over both its ends. The coil was connected to an HF generator with an output of 50 KW. The temperature of the substrate surface was measured by means of a pyrometer with a precision of ± 10° C.

As $SiH_4$ source a commercially available gas mixture was used consisting of 95% argon and 5% $SiH_4$. The carrier gases had a purity of 99.998%; the $CO_2$ was suitable for chromatographic purposes; the NOCl was used in the form commercially available in gas bottles, without any further purging.

In the three given examples, five respective silicon substrates have been processed. The given measured values are average values of the measurings performed at the respective five substrates. The variations measured at the five respective substrates are given in the table. For determining the growth rate at the measured thickness of the layer has been divided by the growing time. The layer thickness and, additionally, the refractive index were determined with an ellipsometer from the change of the degree of polarization of a polarized light beam reflected at the grown layers. The refractive index of the grown layers is proportional to their density. In the case of the grown layers. The refractive index of the grown layers is proportional to their density. In the case of the grown layers, it was in the range which is standard for pyrolytic $SiO_2$ layers. The number of charge carriers was found through C/V measurings, taking into account the thickness of the grown layers. In these measurings, a slowly changing direct voltage $V_G$ is applied to the silicon and to a metal contact deposited on the grown layer, said voltage being applied at the same time to the X-input of an XY-recorder. Superposed to direct voltage $V_G$ there is an alternating voltage with a low amplitude $\Delta V_G$ which at each half-period reverses the charge of the metal-oxide-silicon capacity. With uniform alternating voltage, the current in the alternating current circuit depends on capacity C only. Out of the current, a voltage proportional to C can be generated at a precision resistor, said voltage being recorded by tye XY-recorder as a function of $V_G$. Prior to each growing process, the reaction tube was carefully etched, rinsed, and dried.

If the measured values obtained in the three examples are compared it is evident that by means of the method described here, at a temperature lower by 100° C, the same up to approximately 3-fold growth rates were obtained, in accordance with the respective conditions, as compared with the oxidation with $CO_2$. The relatively low growth temperature permits, contrary to the oxidation with $CO_2$, also the growing of layers in an advanced state of the production of integrated circuits by means of the process described here, because at these temperatures and the reaction times used there is no risk of the further migration of p/n junctions made in previous manufacturing steps by means of diffusion. The particular advantage of the method described here as compared with known processes finally consists in that it permits the growing of layers whose charge number per $cm^2$ is lower by approximately one order than in the layers grown by means of the known methods. The number of charge carriers per $cm^2$ measured in Example 2 can be further reduced to $\leq 5\times10^{10}$ upon densification of the $SiO_2$ layer under the effect of heat.

While the invention has been particularly shown and described with reference to the preferred embodiments thereof, it will be understood by those skilled in the art that the changes in form and detail may be made therein without departing from the spirit and scope of the invention.

What is claimed is:

1. A method of growing pyrolytic silicon dioxide layers on a heated substrate wherein the resulting charge carrier numbers per $cm^2$ is less than about $10^{12}$ comprising mixing nitrosyl chloride and silane in a volume ratio between approximately 4:1 and approximately 50:1 in the presence of a carrier gas, and passing the gaseous mixture over said substrate while maintaining a predetermined substrate temperature.

2. A method as claimed in claim 1 wherein the nitrosyl chloride and silane are mixed in a volume ratio of approximately 13:1.

3. A method as claimed in claim 1 wherein the method takes place at predetermined substrate temperatures between about 780° and 1000° C.

4. A method as claimed in claim 3 wherein the method takes place at substrate temperatures of less than 900° C.

5. A method as claimed in claim 1 wherein the carrier gas is an inert gas.

6. A method as claimed in claim 5 wherein the carrier gas is nitrogen.

7. A method as claimed in claim 1 wherein the pyrolization takes place at a substrate temperature of 880° C in a gas flow consisting of about 30 liters nitrogen per minute, 0.5 liters argon containing 5 volume-% silane per minute, and 0.15 liters nitrosyl chloride per minute, and flowing through a reaction tube with a flow cross-section of about 40 $cm^2$.

* * * * *